United States Patent
Goh et al.

(10) Patent No.: US 9,257,368 B2
(45) Date of Patent: Feb. 9, 2016

(54) MICROELECTRIC PACKAGE UTILIZING MULTIPLE BUMPLESS BUILD-UP STRUCTURES AND THROUGH-SILICON VIAS

(75) Inventors: Eng Huat Goh, Aver Itam (MY); Hoay Tien Teoh, Paya Terubong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/996,839

(22) PCT Filed: May 14, 2012

(86) PCT No.: PCT/US2012/037787
§ 371 (c)(1),
(2), (4) Date: Oct. 1, 2013

(87) PCT Pub. No.: WO2013/172814
PCT Pub. Date: Nov. 21, 2013

(65) Prior Publication Data
US 2014/0021635 A1   Jan. 23, 2014

(51) Int. Cl.
*H01L 23/48*    (2006.01)
*H01L 23/52*    (2006.01)
(Continued)

(52) U.S. Cl.
CPC .............. *H01L 23/481* (2013.01); *H01L 21/50* (2013.01); *H01L 23/295* (2013.01); *H01L 23/5389* (2013.01); *H01L 24/19* (2013.01); *H01L 24/20* (2013.01); *H01L 24/25* (2013.01); *H01L 24/13* (2013.01); *H01L 2224/02371* (2013.01); *H01L 2224/02379* (2013.01);
(Continued)

(58) Field of Classification Search
CPC ........ H01L 23/481; H01L 23/52; H01L 29/40
USPC ........... 257/690, 774, 782; 438/121, 124, 629
See application file for complete search history.

(56) References Cited

U.S. PATENT DOCUMENTS 5,353,498 A    10/1994    Fillion et al.
5,497,033 A     3/1996    Fillion et al.
(Continued)

FOREIGN PATENT DOCUMENTS

JP    2012-074536 A    4/2012
KR    10-2010-0038232 A    4/2010
(Continued)

OTHER PUBLICATIONS

Ma, "Direct Build-Up Layer on an Encapsulated Die Package", U.S. Appl. No. 09/640961, filed Aug. 16, 2000, 70 pages.
(Continued)

*Primary Examiner* — Phuc Dang
(74) *Attorney, Agent, or Firm* — Winkle, PLLC

(57) ABSTRACT

A microelectronic package having a first bumpless build-up layer structure adjacent an active surface and sides of a microelectronic device and a second bumpless build-up layer structure adjacent a back surface of the microelectronic device, wherein conductive routes are formed through the first bumpless build-up layer from the microelectronic device active surface to conductive routes in the second bumpless build-up layer structure and wherein through-silicon vias adjacent the microelectronic device back surface and extending into the microelectronic device are electrically connected to the second bumpless build-up layer structure conductive routes.

30 Claims, 3 Drawing Sheets

(51) Int. Cl.
*H01L 29/40* (2006.01)
*H01L 21/50* (2006.01)
*H01L 23/00* (2006.01)
*H01L 23/29* (2006.01)
*H01L 23/538* (2006.01)

(52) U.S. Cl.
CPC ............... *H01L 2224/0401* (2013.01); *H01L 2224/04105* (2013.01); *H01L 2224/05567* (2013.01); *H01L 2224/12105* (2013.01); *H01L 2224/13022* (2013.01); *H01L 2224/13111* (2013.01); *H01L 2224/13116* (2013.01); *H01L 2224/2518* (2013.01); *H01L 2924/00014* (2013.01); *H01L 2924/18162* (2013.01)

(56) References Cited

U.S. PATENT DOCUMENTS

| | | |
|---|---|---|
| 5,510,649 A | 4/1996 | Adhihetty et al. |
| 5,527,741 A | 6/1996 | Cole et al. |
| 5,841,193 A | 11/1998 | Eichelberger |
| 6,154,366 A | 11/2000 | Ma et al. |
| 6,159,767 A | 12/2000 | Eichelberger |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,472,762 B1 | 10/2002 | Kutlu |
| 6,489,185 B1 | 12/2002 | Towle et al. |
| 6,507,122 B2 | 1/2003 | Blackshear |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,144,756 B1 | 12/2006 | Wang et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,459,782 B1 | 12/2008 | Li |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,723,164 B2 | 5/2010 | Lu et al. |
| 7,851,905 B2 | 12/2010 | Chrysler et al. |
| 8,035,216 B2 | 10/2011 | Skeete |
| 8,093,704 B2 | 1/2012 | Palmer et al. |
| 8,105,934 B2 | 1/2012 | Kwon et al. |
| 8,264,849 B2 | 9/2012 | Guzek |
| 8,304,913 B2 | 11/2012 | Nalla et al. |
| 8,319,318 B2 | 11/2012 | Nalla et al. |
| 8,497,587 B2 | 7/2013 | Ma |
| 8,535,989 B2 | 9/2013 | Sankman et al. |
| 2001/0015492 A1 | 8/2001 | Akram et al. |
| 2002/0088116 A1 | 7/2002 | Milkovich et al. |
| 2005/0062173 A1* | 3/2005 | Vu et al. ............... 257/787 |
| 2006/0186536 A1 | 8/2006 | Hsu |
| 2007/0279885 A1* | 12/2007 | Basavanhally et al. ...... 361/799 |
| 2008/0128916 A1 | 6/2008 | Soejima et al. |
| 2008/0308917 A1* | 12/2008 | Pressel et al. ............. 257/676 |
| 2008/0315377 A1 | 12/2008 | Eichelberger et al. |
| 2008/0315391 A1 | 12/2008 | Kohl et al. |
| 2008/0315398 A1 | 12/2008 | Lo et al. |
| 2009/0072382 A1 | 3/2009 | Guzek |
| 2009/0079064 A1 | 3/2009 | Tang et al. |
| 2009/0121347 A1 | 5/2009 | Kasai et al. |
| 2009/0152743 A1 | 6/2009 | Jomaa et al. |
| 2009/0212416 A1 | 8/2009 | Skeete |
| 2009/0236031 A1 | 9/2009 | Sunohara et al. |
| 2010/0013101 A1 | 1/2010 | Hedler et al. |
| 2010/0032827 A1* | 2/2010 | Hsu ............................ 257/692 |
| 2010/0044855 A1 | 2/2010 | Eichelberger et al. |
| 2010/0047970 A1 | 2/2010 | Eichelberger et al. |
| 2010/0073894 A1 | 3/2010 | Mortensen et al. |
| 2010/0127394 A1 | 5/2010 | Ramiah et al. |
| 2010/0237481 A1 | 9/2010 | Chi et al. |
| 2011/0089546 A1 | 4/2011 | Bayan |
| 2011/0101491 A1 | 5/2011 | Skeete et al. |
| 2011/0108999 A1 | 5/2011 | Nalla et al. |
| 2011/0156231 A1 | 6/2011 | Guzek |
| 2011/0156235 A1 | 6/2011 | Yuna |
| 2011/0156261 A1 | 6/2011 | Kapusta et al. |
| 2011/0215464 A1 | 9/2011 | Guzek |
| 2011/0221069 A1* | 9/2011 | Kunimoto ................. 257/774 |
| 2011/0228464 A1 | 9/2011 | Guzek et al. |
| 2011/0241186 A1 | 10/2011 | Nalla et al. |
| 2011/0241195 A1 | 10/2011 | Nalla et al. |
| 2011/0241215 A1 | 10/2011 | Sankman et al. |
| 2011/0254124 A1 | 10/2011 | Nalla et al. |
| 2011/0272795 A1* | 11/2011 | Chang ....................... 257/680 |
| 2011/0281375 A1 | 11/2011 | Swaminathan et al. |
| 2011/0316140 A1 | 12/2011 | Nalla et al. |
| 2012/0001339 A1 | 1/2012 | Malatkar |
| 2012/0005887 A1 | 1/2012 | Mortensen et al. |
| 2012/0009738 A1 | 1/2012 | Crawford et al. |
| 2012/0074581 A1 | 3/2012 | Guzek et al. |
| 2012/0112336 A1 | 5/2012 | Guzek et al. |
| 2012/0139095 A1 | 6/2012 | Manusharow et al. |
| 2012/0139116 A1 | 6/2012 | Manusharow et al. |
| 2012/0326271 A1 | 12/2012 | Teh et al. |
| 2013/0003319 A1 | 1/2013 | Malatkar et al. |
| 2013/0203265 A1* | 8/2013 | Hsiao ........................ 438/759 |
| 2013/0328207 A1 | 12/2013 | Sankman et al. |

FOREIGN PATENT DOCUMENTS

| | | |
|---|---|---|
| KR | 10-2010-0105506 A | 9/2010 |
| WO | 2013/003257 A2 | 1/2013 |
| WO | 2013/003695 A2 | 1/2013 |
| WO | 2013/003257 A3 | 3/2013 |
| WO | 2013/003695 A3 | 5/2013 |
| WO | 2013/172814 A1 | 11/2013 |

OTHER PUBLICATIONS

International Search Report and Written Opinion received for PCT Application No. PCT/US2012/037787, mailed on Jul. 26, 2013, 11 pages.
Office Action received for Taiwan Patent Application No. 101119764, mailed on Dec. 20, 2012, 2 pages of Office Action only.

(56) References Cited

OTHER PUBLICATIONS

International Preliminary Report on Patentability and Written Opinion received for PCT Patent Application No. PCT/US2012/037787, mailed on Nov. 27, 2014, 8 pages.

International Search Report and Written Opinion received for PCT Patent Application No. PCT/US2012/041714, mailed on Feb. 26, 2013, 10 pages.

International Search Report and Written Opinion received for PCT Patent Application No. PCT/US2012/043945, mailed on Jan. 10, 2013, 12 pages.

International Search Report and Written Opinion received for PCT Patent Application No. PCT/US2012/044871, mailed on Jan. 10, 2013, 10 pages.

Office Action received for Taiwan Patent Application No. 102115911, mailed on Feb. 26, 2015, 10 Pages of English Translation & 10 pages of Taiwan Office Action.

* cited by examiner

MICROELECTRIC PACKAGE UTILIZING MULTIPLE BUMPLESS BUILD-UP STRUCTURES AND THROUGH-SILICON VIAS

TECHNICAL FIELD

Embodiments of the present description generally relate to the field of microelectronic packages and, more particularly, to a microelectronic package having a first bumpless build-up layer structure adjacent an active surface and sides of a microelectronic device and a second bumpless build-up layer structure adjacent to a back surface of the microelectronic device, wherein conductive routes are formed through the first bumpless build-up layer from the microelectronic device active surface to conductive routes in the second bumpless build-up layer structure, and wherein through-silicon vias adjacent the microelectronic device back surface and extending into the microelectronic device are electrically connected to the second bumpless build-up layer structure conductive routes.

BACKGROUND ART

The microelectronic industry is continually striving to produced ever faster and smaller microelectronic packages for use in various mobile electronic products, such as portable computers, electronic tablets, cellular phones, digital cameras, and the like. Typically, a microelectronic package must have a significant number of conductive routes (for the routing of power/ground and input/output signals) between a microelectronic device, such a microprocessor, a chipset, a graphics device, a wireless device, a memory device, an application specific integrated circuit, or the like, and external interconnects used to connect the microelectronic package to external components, such as motherboards, interposers, printed circuit boards, and the like. The formation of the significant number of conductive routes may necessitate the formation in a relatively large microelectronic device, may require stringent design rules, and/or may require numerous layers of dielectric material and conductive traces within an interconnection layer to achieve a proper routing to the external interconnects.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF THE EMBODIMENTS

Figure 1:
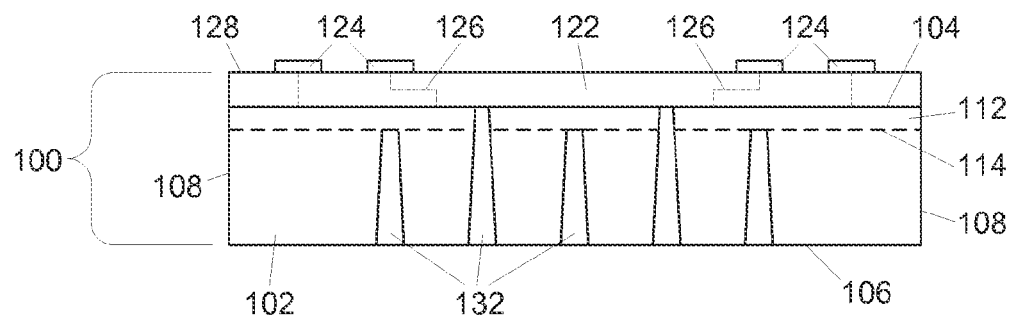
FIG. 1 illustrates a side cross-sectional view of a microelectronic device, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description may include a microelectronic package having a first bumpless build-up layer structure adjacent an active surface and sides of a microelectronic device and a second bumpless build-up layer structure adjacent a back surface of the microelectronic device, wherein conductive routes are formed through the first bumpless build-up layer from the microelectronic device active surface to conductive routes in the second bumpless build-up layer structure and wherein through-silicon vias adjacent the microelectronic device back surface and extending into the microelectronic device are electrically connected to the second bumpless build-up layer structure conductive routes. The various embodiments of the present description of using a combination of through-silicon via and bumpless build-up layer technology may allow for the strategic redistribution of conductive routes to both active and back surfaces of the microelectronic device, which may ultimately result in a reduction in the required size of the microelectronic device (as will be understood to those skilled in the art, the size of a microelectronic device is governed by the perimeter of the input/output signal area available). The various embodiments of the present description may also reduce the cost of the resulting microelectronic package by allowing of less stringent design rules and by allowing a lower number of dielectric layers and conductive trace layers required for the formation of conductive routes for routing power/ground and input/output signals.

In one embodiment of the present description, a microelectronic device 100, such as a microprocessor, a chipset, a controller, a graphics device, a wireless device, a memory device, an application specific integrated circuit, or the like, may be formed. The microelectronic device 100 may be formed from a semiconducting substrate 102, such as silicon, silicon-on-insulator, gallium arsenide, silicon-germanium, or the like, having an active surface 104, which has integrated circuitry 112 formed therein and/or thereon (illustrated as an area between the semiconducting substrate active surface 104 and dashed line 114). The microelectronic device 100 may further include an interconnection layer 122 formed on the semiconducting substrate active surface 104. The microelectronic device interconnection layer 122 may form electrical connections (shown as dashed lines 126) between bonds pads 124 formed in or on the microelectronic device interconnection layer 122 and the microelectronic device integrated circuitry 112. The microelectronic device interconnection layer 122 may be made of alternating dielectric layers and patterned conductive trace layers connected with conductive vias extending through the dielectric layers (not shown), as will be understood by those skilled in the art. The patterned conductive traces may be any appropriate conductive material, including but not limited to, copper, aluminum, silver, gold, alloys thereof, and the like. The dielectric layers may be any appropriate dielectric material, including but not limited to, silicon dioxide ($SiO_2$), silicon oxynitride ($SiO_xN_y$), and silicon nitride ($Si_3N_4$) and silicon carbide (SiC), as well as silica-filled epoxies and the like. Thus, the microelectronic device 100 may include an active surface 128 (e.g. an external surface of the microelectronic device interconnect layer 122), an opposing back surface 106, and at least one side 108 extending between the microelectronic device active surface 128 and the microelectronic device back surface 106.

As further illustrated in FIG. 1, a plurality of through-silicon vias 132 may be formed from the microelectronic device back surface 106 to either the microelectronic device integrated circuitry 112 or through the microelectronic device integrated circuitry 112 to the microelectronic device interconnection layer 122 to form electrical routes therebetween. The techniques and processes for forming the microelectronic device through-silicon vias 132 is well known in the art, and may include etching or drilling (such as by laser or ion bombard) vias into the microelectronic device semiconductive substrate 102 and/or the microelectronic device integrated circuitry 112, and disposing a conductive material, including but not limited to, copper, aluminum, silver, gold, alloys thereof and the like, within the vias. The conductive material may be formed by any known techniques including but not limited to deposition and plating techniques.

Figure 2:
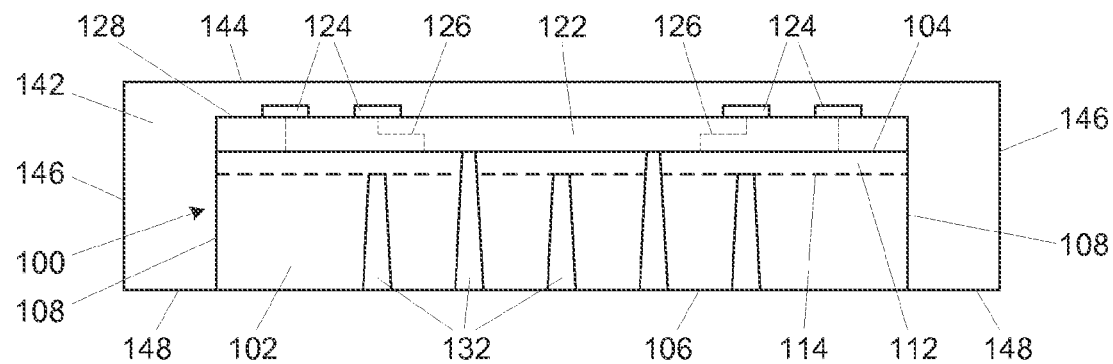
FIG. 2 illustrates a side cross-sectional view of the microelectronic device of FIG. 1 having a first dielectric material layer formed proximate an active surface and at least one side of the microelectronic device, according to an embodiment of the present description.

As shown in FIG. 2, a first dielectric material 142 may be formed adjacent to the microelectronic device active surface 128 and adjacent to the microelectronic device sides 108. The first dielectric material 142 may form a first surface 144 substantially parallel to the microelectronic device active surface 128, at least one side surface 146 substantially parallel to the at least one microelectronic device sides 108, and a second surface 148 substantially planar with the microelectronic device back surface 106. The first dielectric material 142 may include any appropriate dielectric material, including but not limited to a silica-filled epoxy, such as build-up films available from Ajinomoto Fine-Techno Co., Inc., 1-2 Suzuki-cho, Kawasaki-ku, Kawasaki-shi, 210-0801, Japan (e.g. Ajinomoto ABF-GX13™, Ajinomoto GX92™, and the like). The first dielectric material 142 may be formed by any appropriate technique, including deposition and molding.

Figure 3:
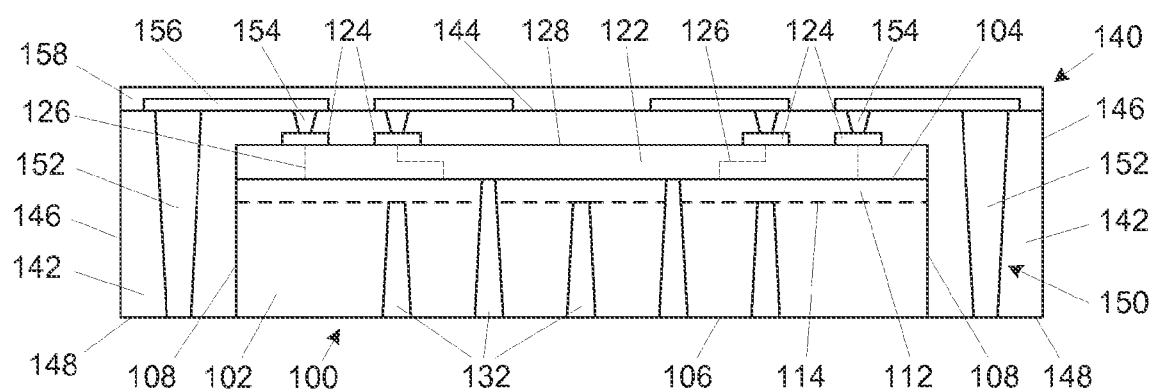
FIG. 3 illustrates a side cross-sectional view of the microelectronic device of FIG. 2 having at least one conductive route formed in and on the first dielectric material layer to form a first bumpless build-up layer, according to an embodiment of the present description.

As shown in FIG. 3, at least one first surface-to-back surface conductive via 152 may be formed from the first dielectric material first surface 144 to the first dielectric material second surface 148. A least one microelectronic device conductive via 154 may be formed from the first dielectric material first surface 144 to at least one of the microelectronic device bond pads 124. At least one conductive trace 156 may be formed on the first dielectric material first surface 144 with the least one conductive trace 156 connecting a least one microelectronic device conductive via 154 to at least one first surface-to-back surface conductive via 152. Thus, a conductive route 150 may be result from the connection of the microelectronic device conductive via 154, the conductive trace 156, and the first surface-to-back surface conductive via 152. A second dielectric material 158 may be formed over the first dielectric material first surface 144 and the conductive traces 156. The first dielectric material 142, the second dielectric material 158, and the conductive routes 150 may form the first bumpless build-up layer structure 140. Although only the first dielectric material 142, the second dielectric material 158, and conductive routes 150 are illustrated, it is understood that any number of dielectric material layers and conductive route components may be utilized. The first surface-to-back surface conductive vias 152 and the microelectronic device conductive vias 154 may be formed by etching or drilling (such as by laser or ion bombard) and disposing a conductive material, including but not limited to, copper, aluminum, silver, gold, alloys thereof and the like, within the vias. The conductive material may be disposed by techniques including but not limited to deposition and plating techniques. The conductive traces 156 may be formed from any appropriate conductive material, as previously discussed, and by any techniques known in the art, including lithography, disposition, plating, and the like.

Figure 4:
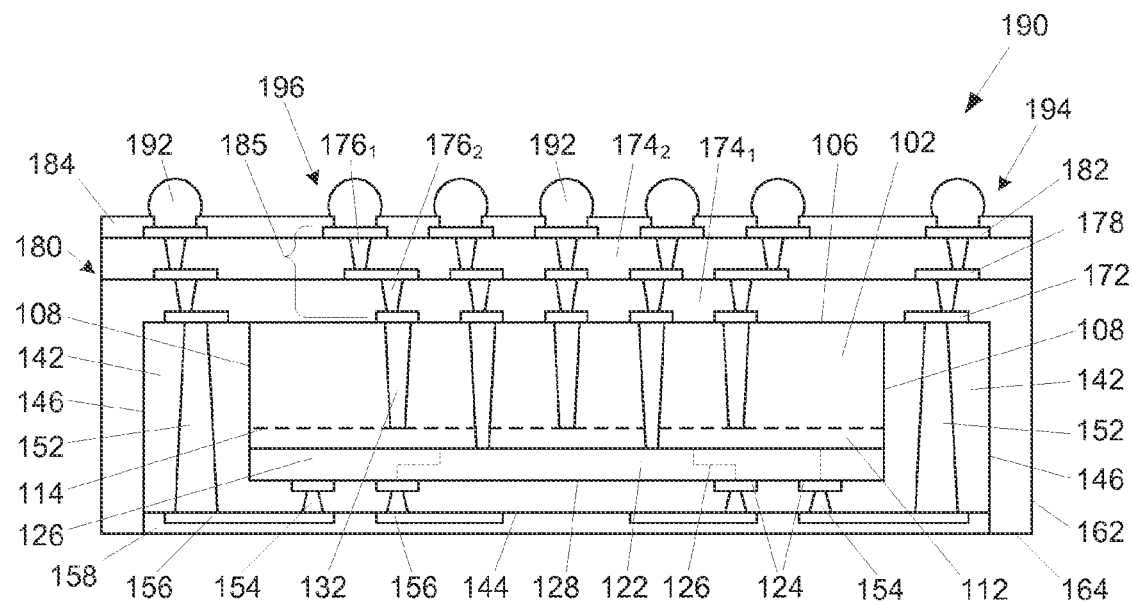
FIG. 4 illustrates a side cross-sectional view of the microelectronic structure of FIG. 3, having a second bumpless build-up layer structure formed proximate a back surface of the microelectronic device to form conductive routes between the first bumpless build-up layer structure and respective external interconnects, and between through-silicon vias formed in the microelectronic device and respective external interconnects, according to an embodiment of the present description.

As shown in FIG. 4, a second bumpless build-up layer structure 180 may be formed adjacent the microelectronic device back surface 106 and the first dielectric material second surface 148. The second build-up layer structure 180 may be formed by forming contact pads 172 in contact with respective first build-up layer structure first surface-to-back surface conductive vias 152 and with respective microelectronic device through-silicon vias 132. A first dielectric material layer $174_1$ may be formed adjacent the microelectronic device back surface 106, the first dielectric material second surface 148, and the contact pads 172. A plurality of first conductive vias $176_1$ may be formed through the first dielectric material layer $174_1$ to contact each respective contact pad 172. A plurality of conductive traces 178 may be formed on the first dielectric material layer $174_1$ to contact respective first conductive vias $176_1$.

As further shown in FIG. 4, a portion of the first dielectric material $174_1$ may extend adjacent the first bumpless build-up layer structure side surface 146 to form at least one side surface 162 substantially parallel to the first bumpless build-up layer structure side surface 146 and to form a bottom surface 164 substantially planar with the second dielectric material 158 of the first bumpless build-up layer structure 140. This may allow for the additional area for the formation of the conductive routes for the second build-up layer structure 180 and the placement of external interconnects, as will be discussed.

As also shown in FIG. 4, a second dielectric material layer 174$_2$ may be formed adjacent the first dielectric material layer 174$_1$ and the plurality of conductive traces 178. A plurality of second conductive vias 176$_2$ may be formed through the second dielectric material layer 174$_2$ to contact each respective conductive trace 178. A plurality of bond pads 182 may be formed on the second dielectric material layer 174$_2$ to contact respective second conductive vias 176$_2$. The combination of the bond pads 172, the first conductive vias 176$_1$, the second conductive vias 176$_2$, the conductive traces 178, and the bond pads 182 may form conductive routes 185 from the first build-up layer structure first surface-to-back surface conductive vias 152 and/or the microelectronic device through-silicon vias 132. The first dielectric material layer 174$_1$, the second dielectric material layer 174$_2$ and the conductive routes 185 may form the second bumpless build-up layer structure 180.

The first dielectric material layer 174$_1$ and the second dielectric material layer 174$_2$ may be formed from any appropriate dielectric materials and by any known techniques, such as those previously discussed. The contact pads 172, the first conductive vias 176$_1$, second conductive vias 176$_2$, the conductive traces 178, and the bond pads 182 may be formed from any appropriate conductive materials and by any know techniques, such as those previously discussed.

As further shown in FIG. 4, a solder resist material 184 may be formed on the second bumpless build-layer structure 180 with at least a portion of each bond pads 182 is exposed therethrough. External interconnects 192 may be formed on each of the bond pads 182, such as with the illustrated ball grid array interconnects, to form a microelectronic package 190. The solder resist material 184 may be utilized to contain the solder material used to form solder-containing external interconnects 192, as will be understood to those skilled in the art. The external interconnects 192 may be used to attach the microelectronic package 190 to other microelectronic structures, such as motherboards, printed circuit boards, and the like. Although the external interconnects 192 are illustrated as ball grid array interconnects, it is understood that the external interconnects 192 may be any appropriate external interconnect, including hut not limited to solder grid arrays, pin grid arrays, land grid arrays, and the like, as will be understood to those skilled in the art. When solder is used to form the external interconnects 192, such as ball grid arrays and solder grid arrays, the solder may be any appropriate material, including, but not limited to, lead/tin alloys and high tin content alloys (e.g. about 90% or more tin), and similar alloys.

A first microelectronic package conductive route 194 may be defined to be a conductive route between the microelectronic device integrated circuitry 112 and an external interconnect 192, which may include the interconnection layer 122, the first bumpless build-up layer structure conductive route 150, and the second bumpless build-up layer structure conductive route 185. A second microelectronic package conductive route 196 may be defined to be a conductive route between the through-silicon via 132 and an external interconnect 192, which may include the second bumpless build-up layer structure conductive route 185.

In one embodiment, at least one of the microelectronic device through-silicon vias 132 may be utilized for the transmission of power or ground signals. Furthermore, at least one of the microelectronic device through-silicon vias 132 may be utilized for the transmission of input/output signals, which may eliminate the need for breakouts, as will be understood to those skilled in the art. Thus, the embodiments of the present description may lead to a reduction in the size and the production costs of a microelectronic package.

It is understood that the embodiments of the present description are not limited to a single microelectronic device and may be utilized with a plurality of microelectronic devices within a single microelectronic package, as will be understood to those skilled in the art.

Figure 5:
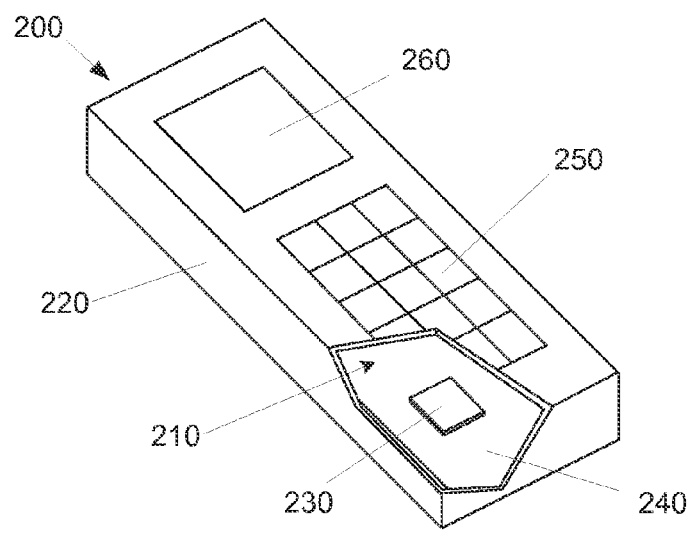
FIG. 5 illustrates an electronic system/device, according to one implementation of the present description.

An embodiment of one process of fabricating a microelectronic structure of the present description is illustrated in a flow diagram 300 of FIG. 5. As defined in block 310, a microelectronic device may be formed having an active surface and an opposing back surface, and at least one through-silicon via extending into the microelectronic device from the microelectronic device back surface. As defined in block 320, a first bumpless build-up layer structure may be formed adjacent the active surface and at least one side of the microelectronic device. A second bumpless build-up layer structure may be formed adjacent the microelectronic device back surface, as defined block 330. As defined in block 340, at least one first package conductive route may be formed through the first bumpless build-up layer structure and the second bumpless build-up layer structure electrically connected to the microelectronic device active surface. At least one second package conductive route may be formed through second bumpless build-up layer structure electrically connected to at least one microelectronic device through-silicon via, as defined in block 350.

Figure 6:
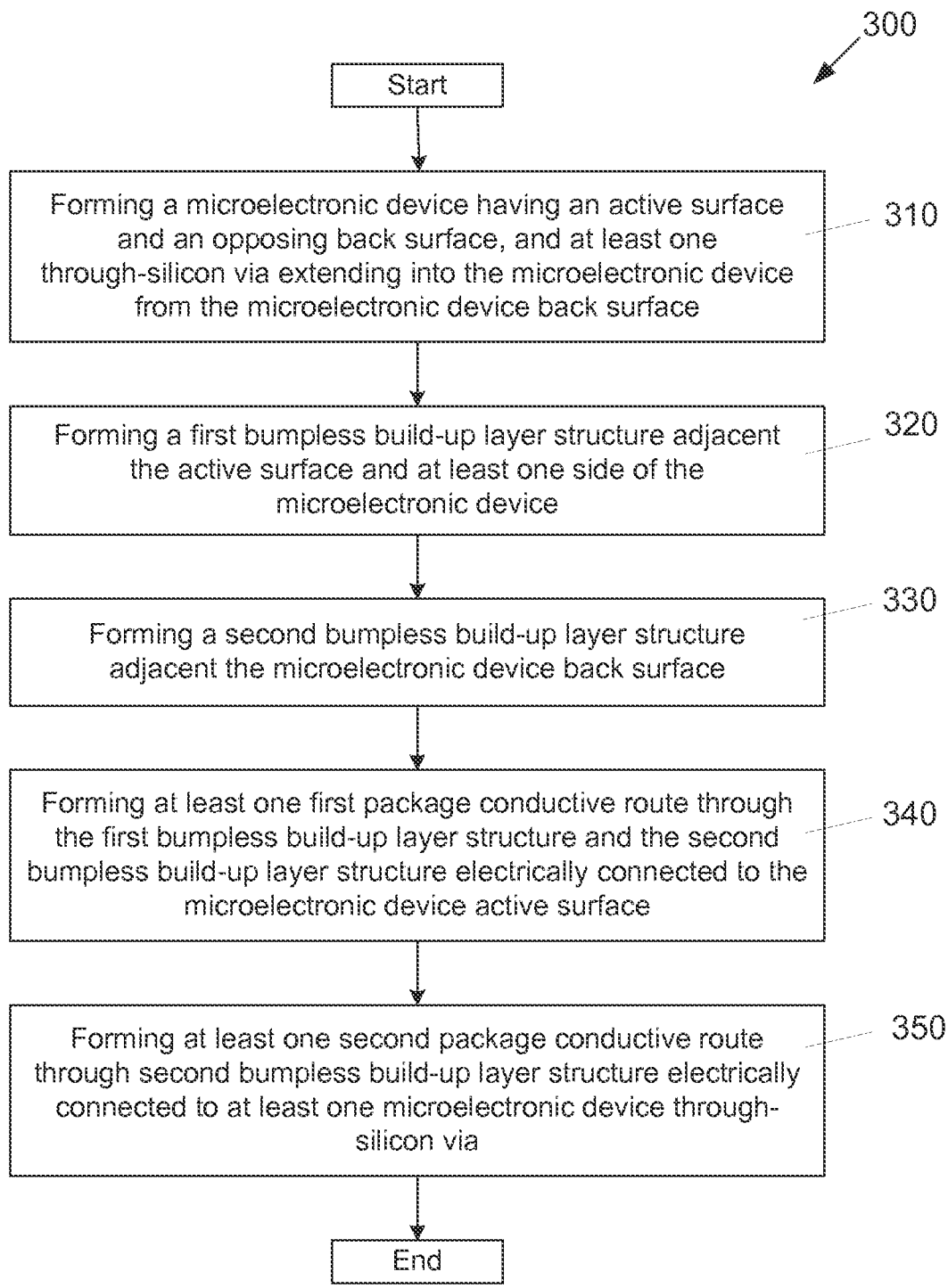
FIG. 6 illustrates a flow diagram of a process for fabrication a microelectronic structure, according to an embodiment of the present description.

FIG. 6 illustrates an embodiment of an electronic system/device 300, such as a portable computer, a desktop computer, a mobile telephone, a digital camera, a digital music player, a web tablet/pad device, a personal digital assistant, a pager, an instant messaging device, or other devices. The electronic system/device 300 may be adapted to transmit and/or receive information wirelessly, such as through a wireless local area network (WLAN) system, a wireless personal area network (WPAN) system, and/or a cellular network. The electronic system/device 300 may include a microelectronic substrate 310 (such as a motherboard, a printed circuit, or the like) within a housing 320. As with the embodiments of the present application, the microelectronic structure 310 may have a microelectronic package 330 (see element 100 of FIG. 4) attached thereto. As previous described with regard to FIGS. 1-4, the microelectronic package 330 may include a first bumpless build-up layer structure adjacent an active surface and sides of the microelectronic device and a second bumpless build-up layer structure adjacent a back surface of the microelectronic device, wherein conductive routes are formed through the first bumpless build-up layer from the microelectronic device active surface to conductive routes in the second bumpless build-up layer structure and wherein through-silicon vias adjacent the microelectronic device back surface are electrically connected to the second bumpless build-up layer structure conductive routes. The microelectronic substrate 310 may be attached to various peripheral devices including an input device 340, such as keypad, and a display device 350, such an LCD display. It is understood that the display device 350 may also function as the input device, if the display device 350 is touch sensitive.

It is understood that the subject matter of the present description is not necessarily limited to specific applications illustrated in FIGS. 1-6. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
   a microelectronic device having an active surface and an opposing back surface, and at least one through-silicon via extending into the microelectronic device from the microelectronic device back surface;
   a first bumpless build-up layer structure formed adjacent the active surface and at least one side of the microelectronic device, wherein the first bumpless build-up layer structure includes a first surface extending over the microelectronic device active surface and a second surface substantially planar to the microelectronic device back surface;
   a second bumpless build-up layer structure abutting the microelectronic device back surface and abutting the first bumpless build-up layer structure second surface;
   at least one first package conductive route extending through the first bumpless build-up layer structure, extending through the second bumpless build-up layer structure, and electrically connected to the microelectronic device active surface; and
   at least one second package conductive route extending through second bumpless build-up layer structure and electrically connected to at least one microelectronic device through-silicon via.

2. The microelectronic package of claim 1, wherein a portion of the second bumpless build-up layer structure extends adjacent a portion of the first bumpless build-up layer adjacent the at least one microelectronic device side.

3. The microelectronic package of claim 1, wherein the microelectronic device further comprises integrated circuitry formed proximate the microelectronic device active surface.

4. The microelectronic package of claim 3, wherein the at least one microelectronic device through-silicon via comprises at least one microelectronic device through-silicon via extending from the microelectronic device back surface to the microelectronic device integrated circuitry.

5. The microelectronic package of claim 1, wherein the microelectronic device further comprises an interconnection layer formed proximate the microelectronic device active surface.

6. The microelectronic package of claim 5, wherein the at least one microelectronic device through-silicon via comprises at least one microelectronic device through-silicon via extending from the microelectronic device back surface to the microelectronic device interconnection layer.

7. The microelectronic package of claim 1, wherein the at least one first package conductive route comprises at least one first package conductive route through the first bumpless build-up layer structure and the second bumpless build-up layer structure electrically connected to the microelectronic device active surface and at least one external interconnect.

8. The microelectronic package of claim 1, wherein the at least one second package conductive route comprises at least one second package conductive route through the second bumpless build-up layer structure electrically connected to at least one microelectronic device through-silicon via and at least one external interconnect.

9. The microelectronic package of claim 1, wherein the microelectronic device comprises a semiconducting substrate having an active surface and a back surface, wherein the semiconducting substrate back surface comprises the microelectronic device back surface, and a microelectronic device interconnection layer adjacent the semiconducting substrate active surface, wherein the microelectronic device interconnection layer comprises the microelectronic device active surface.

10. The microelectronic package of claim 1, wherein the first bumpless build-up layer structure comprises a silica filled epoxy.

11. The microelectronic package of claim 1, wherein the second bumpless build-up layer structure comprises a silica filled epoxy.

12. A method of forming a microelectronic package, comprising:
    forming a microelectronic device having an active surface and an opposing back surface, and at least one through-silicon via extending into the microelectronic device from the microelectronic device back surface;
    forming a first bumpless build-up layer structure adjacent the active surface and at least one side of the microelectronic device, wherein the first bumpless build-up layer structure includes a first surface extending over the microelectronic device active surface and a second surface substantially planar to the microelectronic device back surface;
    forming a second bumpless build-up layer structure abutting the microelectronic device back surface and abutting the first bumpless build-up layer structure second surface;
    forming at least one first package conductive route extending through the first bumpless build-up layer structure, extending through the second bumpless build-up layer structure, and electrically connected to the microelectronic device active surface; and
    forming at least one second package conductive route extending through second bumpless build-up layer structure and electrically connected to at least one microelectronic device through-silicon via.

13. The method of forming the microelectronic package of claim 12, further comprising forming a portion of the second bumpless build-up layer structure to extend adjacent a portion of the first bumpless build-up layer adjacent the at least one microelectronic device side.

14. The method of forming the microelectronic package of claim 12, wherein forming the microelectronic device further comprises forming integrated circuitry proximate the microelectronic device active surface.

15. The method of forming the microelectronic package of claim 14, wherein forming the at least one microelectronic device through-silicon via comprises forming at least one microelectronic device through-silicon via extending from the microelectronic device back surface to the microelectronic device integrated circuitry.

16. The method of forming the microelectronic package of claim 12, wherein forming the microelectronic device further comprises an interconnection layer proximate the microelectronic device active surface.

17. The method of forming the microelectronic package of claim 16, wherein forming the at least one microelectronic device through-silicon via comprises forming at least one microelectronic device through-silicon via extending from the microelectronic device back surface to the microelectronic device interconnection layer.

18. The method of forming the microelectronic package of claim 12, wherein forming the at least one first package conductive route comprises forming at least one first package conductive route through the first bumpless build-up layer structure and the second bumpless build-up layer structure electrically connected to the microelectronic device active surface and at least one external interconnect.

19. The method of forming the microelectronic package of claim 12, wherein forming the at least one second package conductive route comprises forming at least one second package conductive route through the second bumpless build-up layer structure electrically connected to at least one microelectronic device through-silicon via and at least one external interconnect.

20. The method of forming the microelectronic package of claim 12, wherein forming the microelectronic device comprises forming a semiconducting substrate having an active surface and a back surface, wherein the semiconducting substrate back surface comprises the microelectronic device back surface, and a microelectronic device interconnection layer adjacent the semiconducting substrate active surface, wherein the microelectronic device interconnection layer comprises the microelectronic device active surface.

21. The method of forming the microelectronic package of claim 12, wherein forming the first bumpless build-up layer structure comprises forming the first bumpless build-up layer structure from a silica filled epoxy.

22. The method of forming the microelectronic package of claim 12, wherein forming the second bumpless build-up layer structure comprises forming the second bumpless build-up layer structure from a silica filled epoxy.

23. A microelectronic system, comprising:
a housing; and
a microelectronic structure disposed within the housing, comprising:
 a microelectronic substrate; and
 at least one microelectronic package, comprising:
  a microelectronic device having an active surface and an opposing back surface, and at least one through-silicon via extending into the microelectronic device from the microelectronic device back surface;
  a first bumpless build-up layer structure formed adjacent the active surface and at least one side of the microelectronic device, wherein first bumpless build-up layer structure includes a first surface extending over the microelectronic device active surface and a second surface substantially planar to the microelectronic device back surface;
  a second bumpless build-up layer structure abutting the microelectronic device back surface and abutting the first bumpless build-up layer structure second surface;
  at least one first package conductive route extending through the first bumpless build-up layer structure, extending through the second bumpless build-up layer structure, and electrically connected to the microelectronic device active surface; and
  at least one second package conductive route extending through second bumpless build-up layer structure and electrically connected to at least one microelectronic device through-silicon via.

24. The microelectronic system of claim 23, wherein a portion of the second bumpless build-up layer structure extends adjacent a portion of the first bumpless build-up layer adjacent the at least one microelectronic device side.

25. The microelectronic system of claim 23, wherein the microelectronic device further comprises integrated circuitry formed proximate the microelectronic device active surface.

26. The microelectronic system of claim 25, wherein the at least one microelectronic device through-silicon via comprise at least one microelectronic device through-silicon via extending from the microelectronic device back surface to the microelectronic device integrated circuitry.

27. The microelectronic system of claim 23, wherein the microelectronic device further comprises an interconnection layer formed proximate the microelectronic device active surface.

28. The microelectronic system of claim 27, wherein the at least one microelectronic device through-silicon via comprises at least one microelectronic device through-silicon via extending from the microelectronic device back surface to the microelectronic device interconnection layer.

29. The microelectronic system of claim 23, wherein the at least one first package conductive route comprises at least one first package conductive route through the first bumpless build-up layer structure and the second bumpless build-up layer structure electrically connected to the microelectronic device active surface and at least one external interconnect.

30. The microelectronic system of claim 23, wherein the at least one second package conductive route comprises at least one second package conductive route through the second bumpless build-up layer structure electrically connected to at least one microelectronic device through-silicon via and at least one external interconnect.

* * * * *